(12) United States Patent
Bertin et al.

(10) Patent No.: US 6,339,559 B1
(45) Date of Patent: Jan. 15, 2002

(54) DECODE SCHEME FOR PROGRAMMING ANTIFUSES ARRANGED IN BANKS

(75) Inventors: Claude Louis Bertin, South Burlington; John Atkinson Fifield, Underhill; Nicholas Martin van Heel, Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/781,883

(22) Filed: Feb. 12, 2001

(51) Int. Cl.$^7$ .............................................. G11C 17/16
(52) U.S. Cl. ............................ 365/225.7; 365/230.03; 365/230.02; 365/230.06; 365/96; 326/38; 326/37; 326/41
(58) Field of Search .............................. 365/225.7, 200, 365/149, 150, 230.03, 230.02, 230.06, 96; 326/37, 38, 41, 44

(56) References Cited

U.S. PATENT DOCUMENTS

| | | | |
|---|---|---|---|
| 4,485,459 A | | 11/1984 | Venkateswaran ............ 365/200 |
| 4,758,745 A | * | 7/1988 | Elgamal et al. ............... 326/16 |
| 4,811,298 A | | 3/1989 | Helwig et al. ............... 365/200 |
| 5,204,836 A | | 4/1993 | Reed ......................... 365/200 |
| 5,367,207 A | | 11/1994 | Goetting et al. .............. 326/38 |
| 5,422,850 A | | 6/1995 | Sukegawa et al. .......... 365/200 |
| 5,430,679 A | | 7/1995 | Hiltebeitel et al. ......... 365/200 |
| 5,446,693 A | | 8/1995 | Okamoto ................... 365/200 |
| 5,471,427 A | | 11/1995 | Murakami et al. .......... 365/200 |
| 5,737,511 A | | 4/1998 | Chang ........................... 714/7 |
| 5,805,512 A | | 9/1998 | Nakai et al. ................. 365/200 |
| 5,867,433 A | | 2/1999 | Shen et al. ................. 365/200 |
| 5,896,326 A | | 4/1999 | Akashi ....................... 365/200 |
| 6,115,283 A | * | 9/2000 | Hidaka ....................... 365/149 |

* cited by examiner

Primary Examiner—Andrew Q. Tran
(74) Attorney, Agent, or Firm—Scully, Scott, Murphy & Presser; Mark F. Chadurjian, Esq.

(57) ABSTRACT

Described is an antifuse array comprising a plurality of antifuse elements and a plurality of cell plates. Each of the antifuse elements comprises a programming transistor and one of the cell plates. The programming transistor and the cell plate of each antifuse element are both activated to program the antifuse element. Each of the cell plates is coupled to a portion of the plurality of antifuse elements and to one of a plurality of decode circuits, and the decode circuits selectively activate its coupled cell plate. With a preferred embodiment, a multitude of interconnect lines are connected to the antifuses and in particular, each interconnect line intersects each of the cell plates and is associated with one antifuse in each group of antifuses. With this preferred embodiment, the array of antifuses are decoded by predecoding one of the cell plates by elevating the cell plate voltage from ground to a program voltage, and decoding one of the interconnect lines to program one of the antifuses. The intersection of the cell plate set to a program voltage and the decoded interconnect line results in programming a unique antifuse.

15 Claims, 8 Drawing Sheets

| Input | S1 | S0 | Sel1 | Sel2 | Sel3 | Sel4 | Vnb1 | Vnb2 | Vnb3 | Vnb4 |
|---|---|---|---|---|---|---|---|---|---|---|
| 0 | 0 | 0 | 1 | 1 | 1 | 1 | av | av | av | av |
| 0 | 0 | 1 | 1 | 1 | 1 | 1 | av | av | av | av |
| 0 | 1 | 0 | 1 | 1 | 1 | 1 | av | av | av | av |
| 0 | 1 | 1 | 1 | 1 | 1 | 1 | av | av | av | av |
| 1 | 0 | 0 | 0 | 1 | 1 | 1 | Vprog | av | av | av |
| 1 | 0 | 1 | 1 | 0 | 1 | 1 | av | Vprog | av | av |
| 1 | 1 | 0 | 1 | 1 | 0 | 1 | av | av | Vprog | av |
| 1 | 1 | 1 | 1 | 1 | 1 | 0 | av | av | av | Vprog |

(read) Normal Mode Input – 0 → Sein signals are all high → Nbands are grounded
(program) Text Model Input =: → - state combination at S1 S0 decades to 1 at 4
Vprog translator circuits. This pumps up the
decoded Nband to Vprog. The remaining
Nbands are tied to Vss (gnd)

FIG. 9

DECODE SCHEME FOR PROGRAMMING ANTIFUSES ARRANGED IN BANKS

BACKGROUND OF THE INVENTION

This invention generally relates to the programming of programmable integrated circuit structures; and more specifically, the invention relates to the connecting of antifuses to connect elements in an array of logic elements.

Elements for programming PROM's, EEPROM's and logic arrays have included fuses and transistors. It is also possible to make programmable connections using shortable elements referred to as antifuses. An antifuse is an element that before programming has a high impedance and after application of an appropriate voltage, changes to a low impedance conductive state. A thin dielectric, such as silicon dioxide, between two conductive regions, such as aluminum, can serve as an antifuse, programmable by the current and local heat that occurs when sufficient voltage is applied to cause current to flow through the dielectric.

Figure 1:
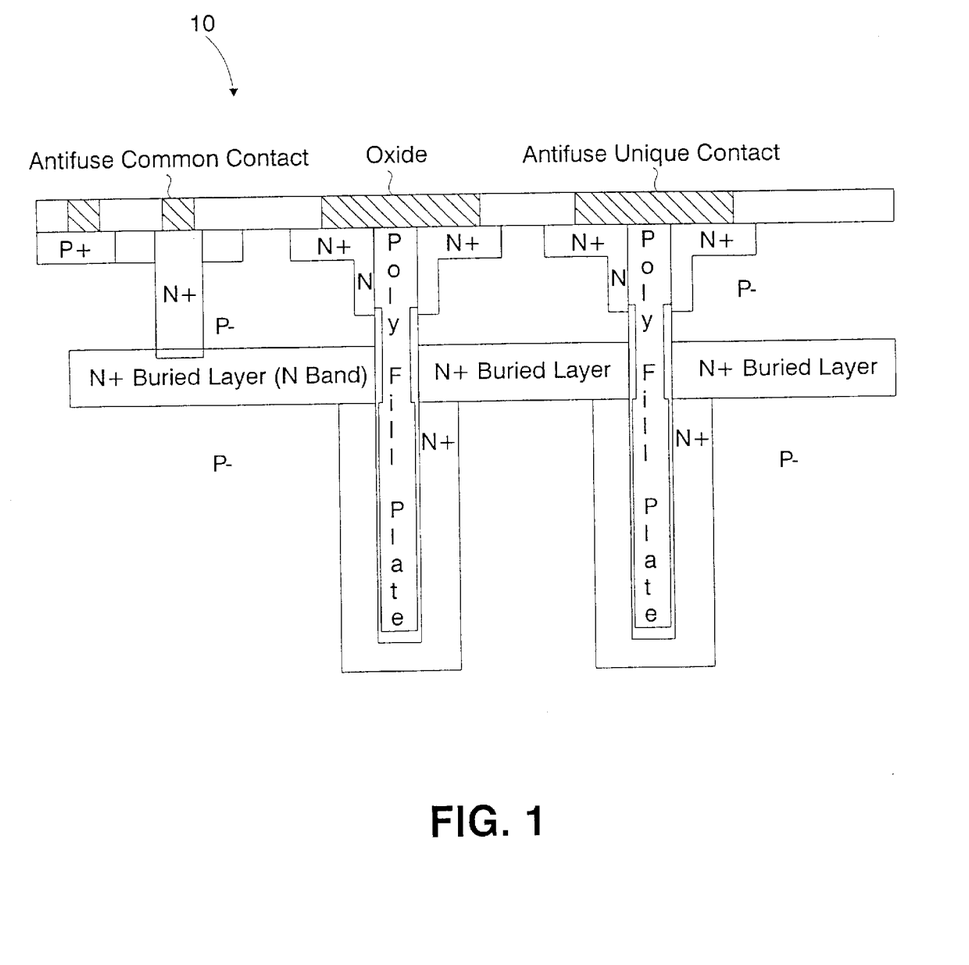
FIG. 1 is a cross-sectional view of a prior art electrically programmable antifuse cell structure.

A three dimensional wiring option is available with some antifuse structures by nature of the layout shown in FIG. 1, which shows a cross-sectional drawing of an electrically programmable antifuse cell structure 10 presently used. The antifuse cell includes an array capacitor that has one of the two terminals contacted to a buried N-band.

The remaining terminal is accessed through an N+ source/drain diffusion. In the unprogrammed state, the capacitor is an open circuit. In the programed state, the cell dielectric has been ruptured by an electrical overvoltage and a connective filament exists between the two plates of the capacitor.

Figure 2:
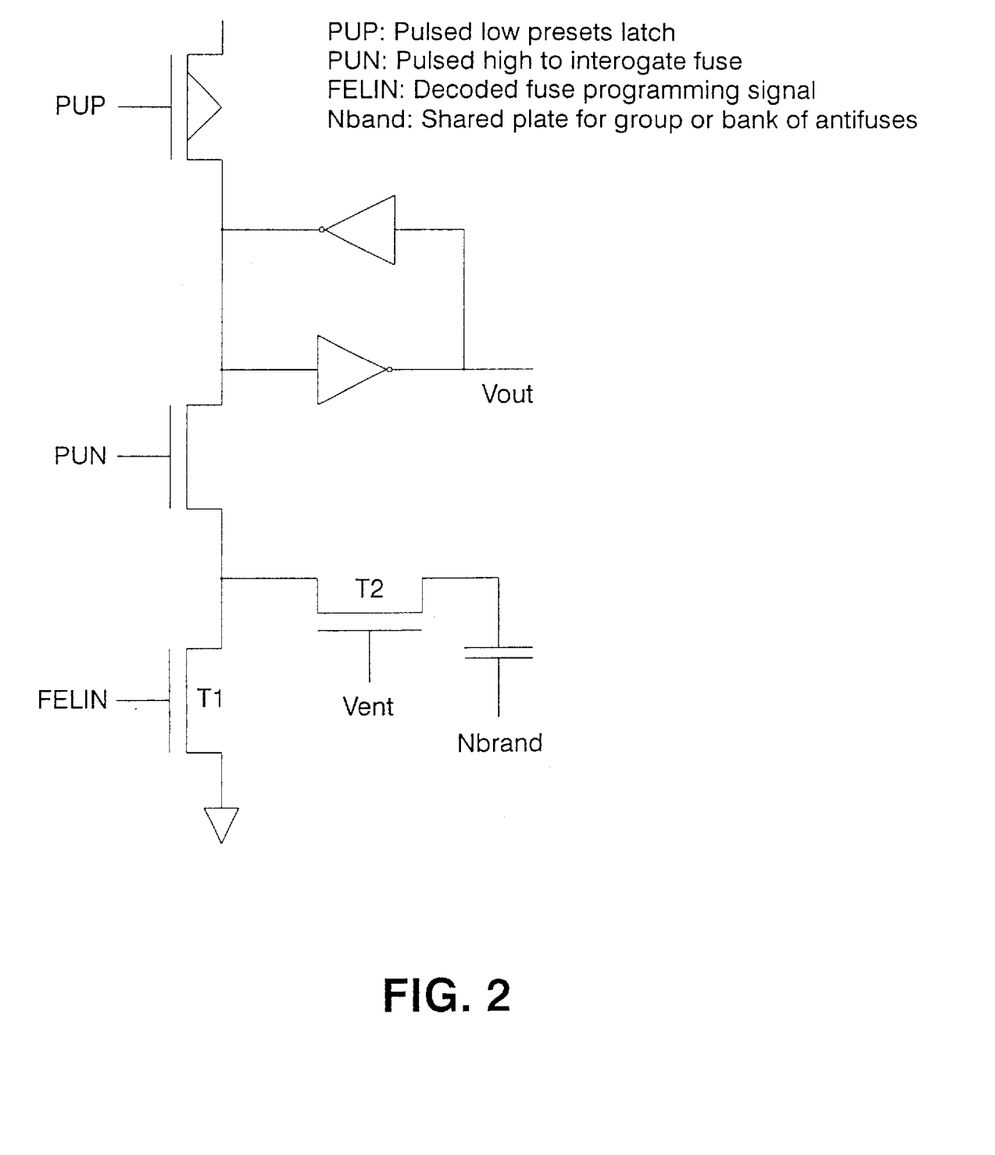
FIG. 2 illustrates a programming transistor incorporated into an antifuse latch circuit.

With reference to FIG. 2, in order to program a unique fuse, a programming transistor T1 is incorporated into the antifuse/fuse latch circuit. When programming a unique antifuse, programming transistor T1 needs to be selected by a decoding scheme.

Figure 3:
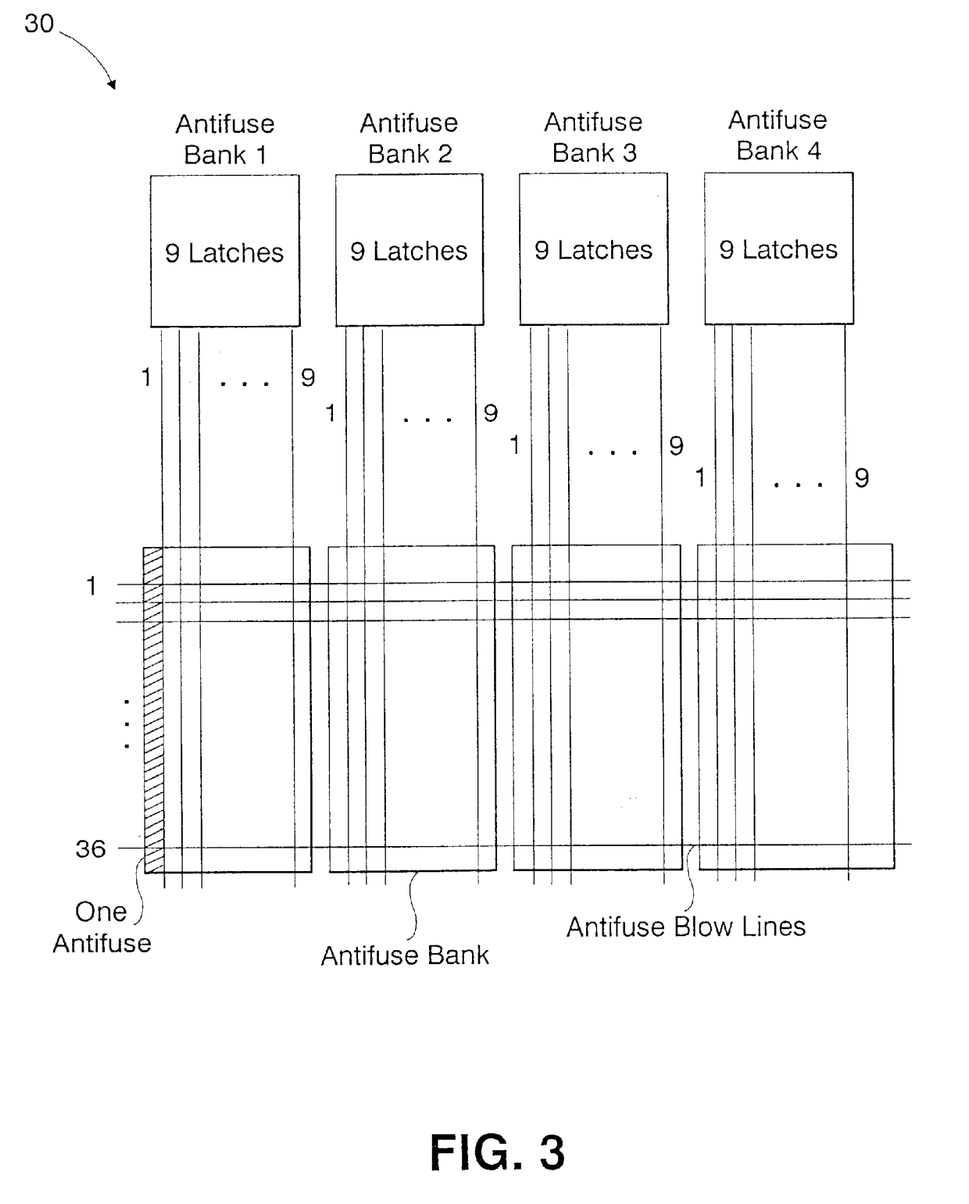
FIG. 3 shows the wiring associated with a conventional decoding scheme.

FIG. 3 shows the wiring, generally referenced at 30, associated with a conventional decoding scheme. The example in FIG. 3 portrays 4 antifuse and latch banks, with each bank including 9 antifuse/fuse latch circuits. Thus, there are a total of 36 programming transistors that need to be uniquely selected by the decoding circuit. In FIG. 3, a total of 36 interconnect lines are used to select one of 36 programming transistors. The layout of these antifuse/fuse latch circuits are interconnect limited.

SUMMARY OF THE INVENTION

An object of this invention is to reduce the number of wires needed for electrical decoding of electronic fuse banks thereby reducing complexity and layout area.

Another object of the present invention is to program antifuses in parallel.

A further object of this invention is to provide an antifuse bank structure that reduces the number of wires needed for electrical decoding and that, at the same time, also allows antifuses to be programmed in parallel.

These and other objectives are attained with an antifuse array, comprising a plurality of antifuse elements and a plurality of cell plates. Each of the antifuse elements comprises a programming transistor and one of the cell plates. The programming transistor and the cell plate of each antifuse element are both activated to program the antifuse element. Each of the cell plates is coupled to a portion of the plurality of antifuse elements and to one of a plurality of decode circuits, and the decode circuits selectively activate its coupled cell plate.

With a preferred embodiment, a multitude of interconnect lines are connected to the antifuses, and in particular, each interconnect line intersects each of the cell plates and is associated with one antifuse in each group of antifuses. With this preferred embodiment, the array of antifuses are decoded by predecoding one of the cell plates by elevating the cell plate which has been at ground voltage to a program voltage, and decoding one of the interconnect lines to program one of the antifuses. The intersection of the cell plate set to the program voltage and the decoded interconnect line results in programming a unique antifuse.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

This invention, generally, relates to a new decoding scheme that reduces the number of interconnect lines used to decode the antifuse programming transistors. The basis is the means used to program an antifuse device. With reference to FIG. 2, programming the antifuse requires first applying a programming voltage to the N-band. Next, a programming transistor Ti is decoded, providing a programming path to ground. In FIG. 2, it may be noted, T2 is used as part of a high voltage protection means to protect the fuse latch circuit, and is "on" when programming the antifuse.

In the conventional decoding scheme of FIG. 3, the N-band is common to all banks. Therefore, transistor T1 uniquely selects each antifuse such that 36 signals are used in order to program 1 of 36 antifuses. The present invention teaches predecoding of one or more antifuse banks via isolated multiple N-bands. The example shown in FIG. 4 has 4 isolated N-bands, in which each N-band corresponds to an antifuse bank containing 9 antifuses. To program, 1 of 4 N-bands is predecoded (selected) by elevating the N-band voltage from ground to the program voltage (Vprog).

Figure 4:
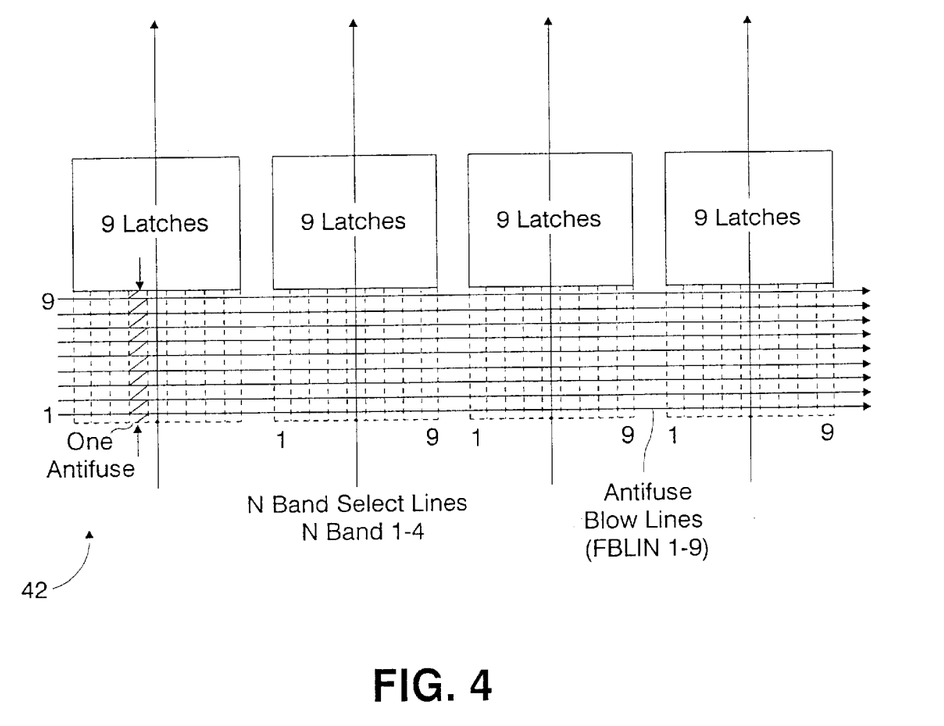
FIG. 4 shows an antifuse bank structure embodying the present invention.

Next, one of 9 interconnect lines 42 is decoded (selected) to program 1 of 36 unique antifuses. The intersection of the N-band set to program voltage, and selected transistor T1, results in programming a unique antifuse. Because the predecoded buried N-bands are in the substrate, under active circuitry, there is no area increase associated with discrete N-band usage. The programming transistor T1 select lines are reduced from 36 to 9. This greatly simplifies decode and wiring. As a result, a smaller antifuse/fuse latch is achieved which contributes to a smaller chip size.

Figure 5:
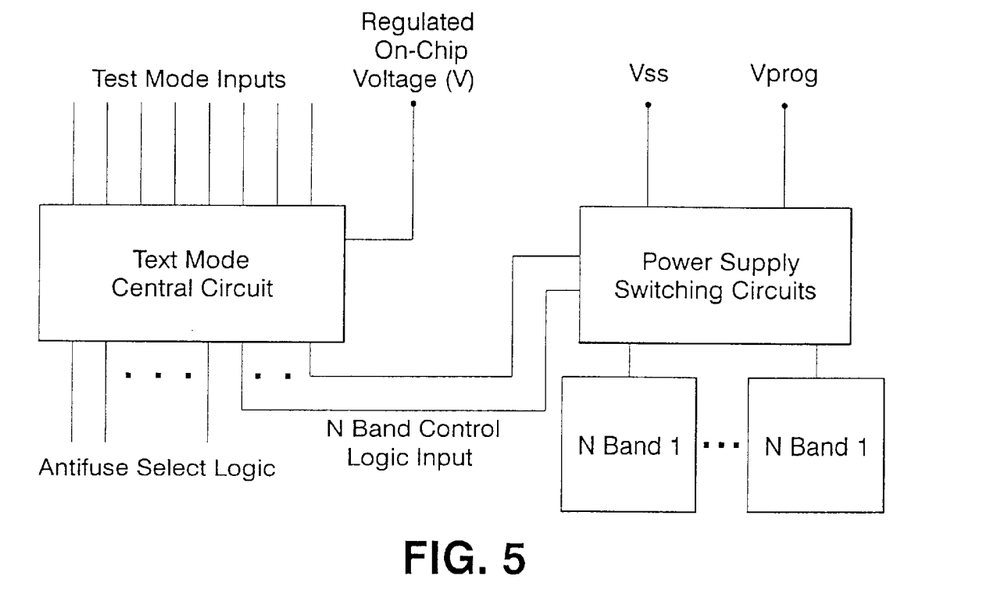
FIG. 5 is a block diagram that illustrates the use of test modes to select/program/configure the antifuse bank structure of FIG. 4.

FIG. 5 shows a block diagram 50 that illustrates the use of test modes to select/program/configure the antifuse banks and antifuses within the banks. The test mode control logic is used to select the appropriate N-band(s) and programming transistors T1(s).

Figure 6:
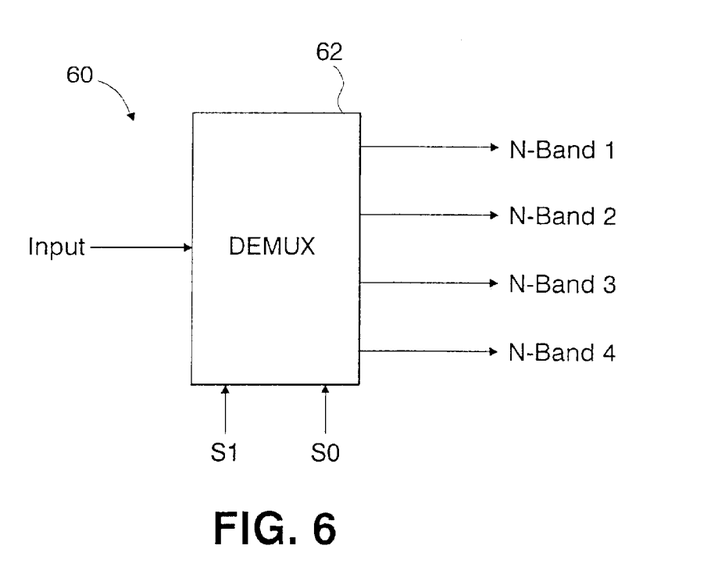
FIG. 6 shows a demux that may be used in the predecoding of the antifuse bank structure of FIG. 4.
Figure 7:
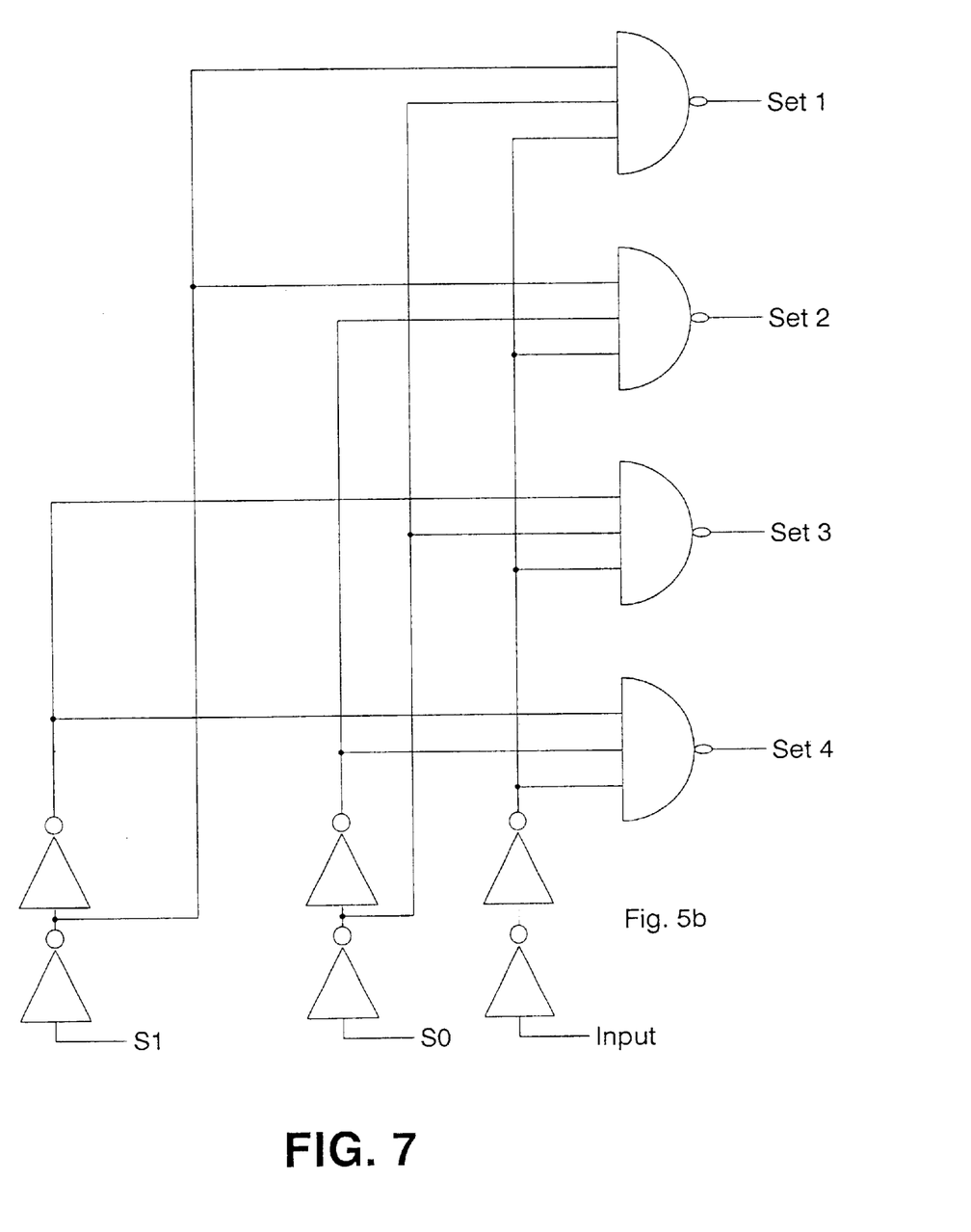
FIG. 7 illustrates the combinational logic used to implement the demux shown in FIG. 6.
Figure 8:
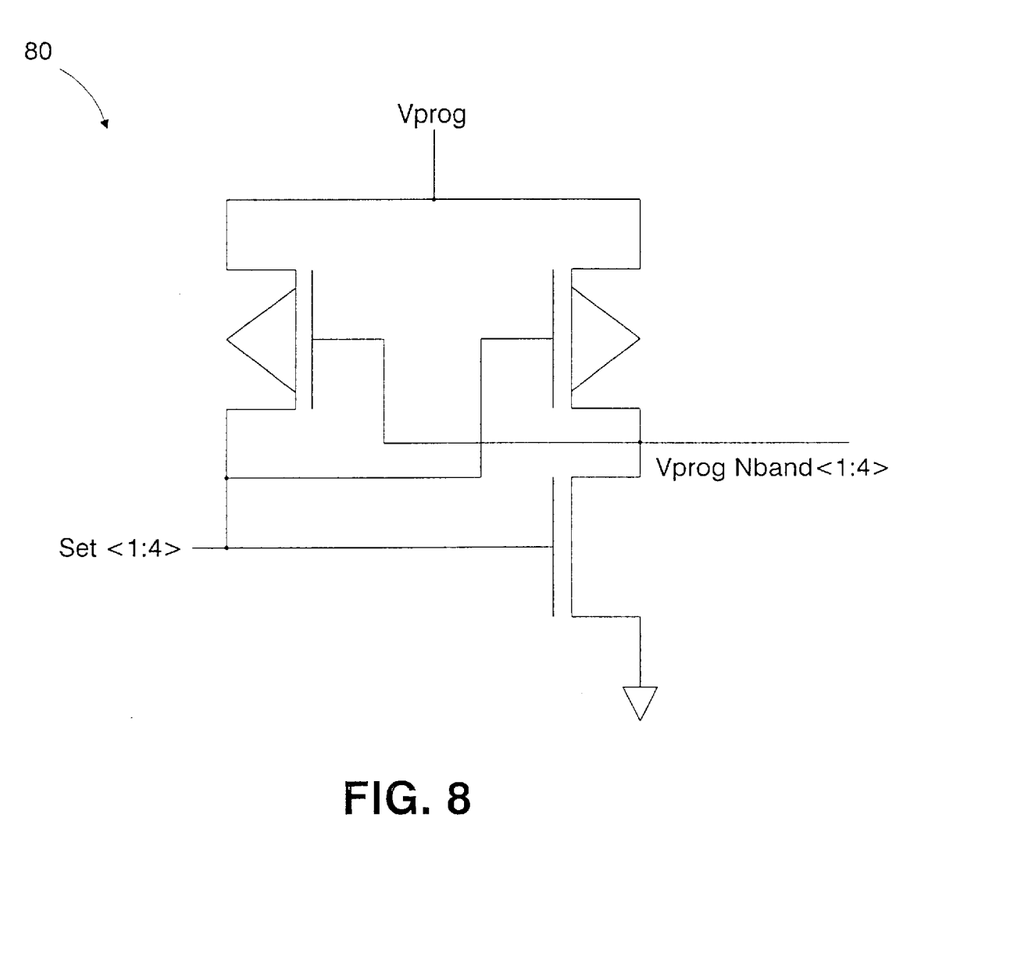
FIG. 8 shows a voltage translator circuit to predecode the antifuse bank structure.

The antifuse select logic preferably uses conventional means. The details for the preferred means of predecoding the N-bands are shown in FIGS. 6–8. FIG. 6 shows a block diagram 60 of a DeMux 62 having three inputs and four outputs. When input=0, the four N-band outputs will be at ground, regardless of the state of S1 and S1. When input=1, the four bit combination of S1 and S1 selects one of four N-bands. The voltage of that selected N-band is elevated from ground to the desired antifuse programming voltage Vprog. The unselected N-bands remain at ground.

Figure 9:
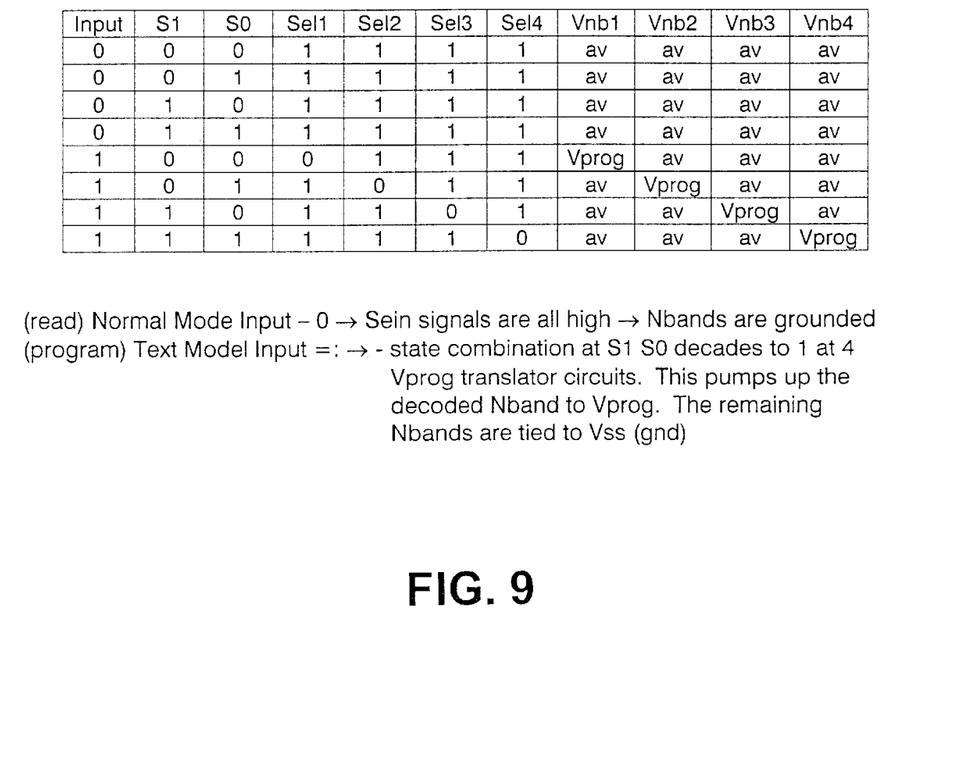
FIG. 9 is a truth table illustrating the operation of the demux of FIG. 7.

For example, the combinational logic used to implement the DeMux 62 is shown in FIG. 7. The DeMux operation is illustrated in Truth Table 1 of FIG. 9. The outputs of FIG. 7 are referred to as Sel<1:4>. Each of these select lines drives a unique voltage translator circuit, such as one of which is shown at 80 in FIG. 8. The output, Vprog N-band <1:4>, of circuit 80 drives the decoded N-band from ground to Vprog.

The invention has been described in terms of 4 antifuse bands with a total of 36 antifuses for illustrative purposes. However, this concept can be expanded to include as many banks and fuses within the banks as desired. Also, the invention has been described in terms of N-bands. However, this invention can also be practiced with P-bands. Also, it may be noted that it is not necessary that the cell plate be buried and this invention can be practiced with non-buried cell plate antifuse structure.

It is desirable to minimize the programming time for antifuses to minimize test time and consequently reduce product cost. Therefore, it is desirable to program more than one antifuse at a time. The isolated N-band approach lends itself well to parallel antifuse programming. For example, in the scheme discussed in connection with FIG. 4, there are 9 antifuses per each of the four banks. These antifuses may be labeled <1–9>b1 for bank 1, <1–9>b2 for bank 2, etc. For instance, to program antifuse 5 in banks 1 and 3, banks 1 and 3 can be predecoded by setting the N-band voltages to Vprog. When transistor T1 is decoded for antifuse 5, four programming transistors T1 are selected, and two antifuses simultaneously programmed in banks 1 and 3. This can be extended to more complex patterns involving more fuses and fuse banks.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. An anti-fuse array comprising:
a plurality of anti-fuse elements, each comprising a programming transistor and a cell plate wherein the programming transistor and the cell plate are both activated to program each anti-fuse element; and
wherein a plurality of cell plates are each coupled to a portion of the plurality of anti-fuse elements and to one of a plurality of decode circuits, and wherein the decode circuits selectively activates its coupled cell plate.

2. An anti-fuse array according to claim 1, wherein:
the plurality of anti-fuse elements includes N-banks of anti-fuse elements; and
a respective one cell plate is coupled to each bank of anti-fuse elements.

3. An anti-fuse array according to claim 2, further comprising a demux to activate selectively each of the cell plates.

4. An anti-fuse array according to claim 3, wherein the demux has two state variable inputs for programming the anti-fuse elements.

5. An anti-fuse array according to claim 1, wherein:
plurality of anti-fuse elements comprise m×n anti-fuses arranged in n banks;
each of said banks includes m anti-fuses; and
a respective one cell plate is associated with each of the banks; and
further comprising a multitude of interconnect lines, and wherein, for each bank, a respective one interconnect line is associated with each anti-fuse of the bank.

6. An anti-fuse array according to claim 5, wherein each of the interconnect lines intersects each of the cell plates and is used to activate one anti-fuse in each bank.

7. An anti-fuse array according to claim 1, wherein the cell plate is a non-buried cell plate.

8. An anti-fuse array comprising:
a plurality of anti-fuse elements;
a plurality of programming transistors each coupled to a different portion of the anti-fuse elements;
a plurality of cell plates each coupled to a different portion of the anti-fuse elements, wherein each anti-fuse element is coupled both to only one of the programming transistors and to only one of the cell plates; and
wherein the anti-fuse elements are programmed by a selective activation of one or more of the programming transistors and one or more of the cell plates.

9. The anti-fuse array of claim 8, wherein the cell plates each comprises a conductive layer in a semiconductor substrate and the programming transistors are on a surface of the substrate.

10. The anti-fuse array of claim 9, wherein the anti-fuse elements each comprise a trench formed in the substrate that is filled with a conductive material.

11. An anti-fuse array according to claim 8, further comprising a demux to activate selectively each of the cell plates.

12. An anti-fuse array according to claim 8, wherein:
the plurality of anti-fuse elements comprise m×n anti-fuses arranged in n banks;
each of said banks includes m anti-fuses;
a respective one cell plate is associated with each of the banks; and
further comprising a multitude of interconnect lines, and wherein, for each bank, a respective one interconnect line is associated with each anti-fuse of the bank.

13. An anti-fuse array according to claim 12, wherein each of the interconnect lines intersects each of the cell plates and is used to activate one anti-fuse in each bank.

14. A method of decoding an array of antifuses, said array comprising m×n antifuses arranged in n banks, each of the banks including m antifuses; and wherein a respective one N-band is associated with each of the banks; within each bank, a respective one interconnect line is associated with each antifuse of the bank; and each of the interconnect lines intersects each of the N-bands and is associated with one antifuse in each bank, the method comprising the steps:

predecoding one of the N-bands by changing the N-band voltage from a first level voltage to a program voltage; and     decoding one of the interconnect lines to program one of the antifuses, wherein the intersection of the N-band set to the program voltage and the decoded interconnect line results in programming a unique antifuse.

15. A method according to claim 14, wherein each of the N-bands is connected to a demux having a control input, a plurality of state inputs, and n outputs, wherein each of the outputs is connected to a respective one of the N-bands, and wherein:

predecoding step includes the step of using the state inputs to control the values of the outputs and to determine which one of the N-bands is decoded.

* * * * *